(12) United States Patent
Maki et al.

(10) Patent No.: US 8,450,150 B2
(45) Date of Patent: May 28, 2013

(54) MANUFACTURING METHOD OF SEMICONDUCTOR INTEGRATED CIRCUIT DEVICE

(75) Inventors: Hiroshi Maki, Tokyo (JP); Makoto Ise, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 514 days.

(21) Appl. No.: 12/756,178

(22) Filed: Apr. 8, 2010

(65) Prior Publication Data

US 2010/0261312 A1    Oct. 14, 2010

(30) Foreign Application Priority Data

Apr. 9, 2009    (JP) ................. 2009-094517

(51) Int. Cl.
*H01L 21/50* (2006.01)
*H01L 23/48* (2006.01)
*H01L 23/498* (2006.01)

(52) U.S. Cl.
USPC ............ 438/109; 257/686; 257/E21.499

(58) Field of Classification Search
None
See application file for complete search history.

(56) References Cited

U.S. PATENT DOCUMENTS

| | | | |
|---|---|---|---|
| 2003/0122262 A1* | 7/2003 | Masuda et al. | 257/777 |
| 2008/0066856 A1 | 3/2008 | Yamazaki et al. | |
| 2008/0150157 A1* | 6/2008 | Nishimura et al. | 257/777 |
| 2009/0224403 A1* | 9/2009 | Fujii | 257/738 |

FOREIGN PATENT DOCUMENTS

| | | |
|---|---|---|
| JP | 2008-098608 A | 4/2008 |
| JP | 2009-27054 A | 2/2009 |
| JP | 2009-065034 A | 3/2009 |

OTHER PUBLICATIONS

Office Action issued Feb. 28, 2013, in Japanese Patent Application No. 2009-094517.

* cited by examiner

*Primary Examiner* — Zandra Smith
*Assistant Examiner* — Pamela E Perkins
(74) *Attorney, Agent, or Firm* — Miles & Stockbridge P.C.

(57) ABSTRACT

While an adhesive layer is provided over the rear surface of a semiconductor chip in die bonding, a lamination processing (main pressure bonding) is necessary for securing the adhesive state of the adhesive layer after the die bonding process (temporary pressure bonding). In this case, typically the hardening of the adhesive is developed by applying heat while pressing down the rear surface of the chip from above with a pressurization member. It has become clear that various problems exist in the lamination processing of the laminate chips by such a mechanical pressurization method as the chip becomes thinner. That is, the problems include chip damage at a part in an overhang state, a chip position shift caused by bending and non-uniform pressurization, and the like.

One invention of the present application is to perform the lamination processing by static gas pressure after laminating and temporarily pressure-bonding the plurality of semiconductor chips over a circuit substrate in the die bonding process of a substrate product.

19 Claims, 17 Drawing Sheets

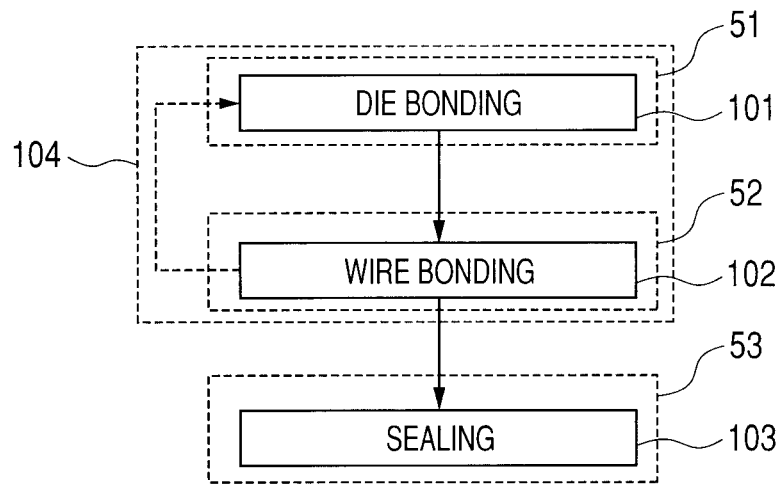
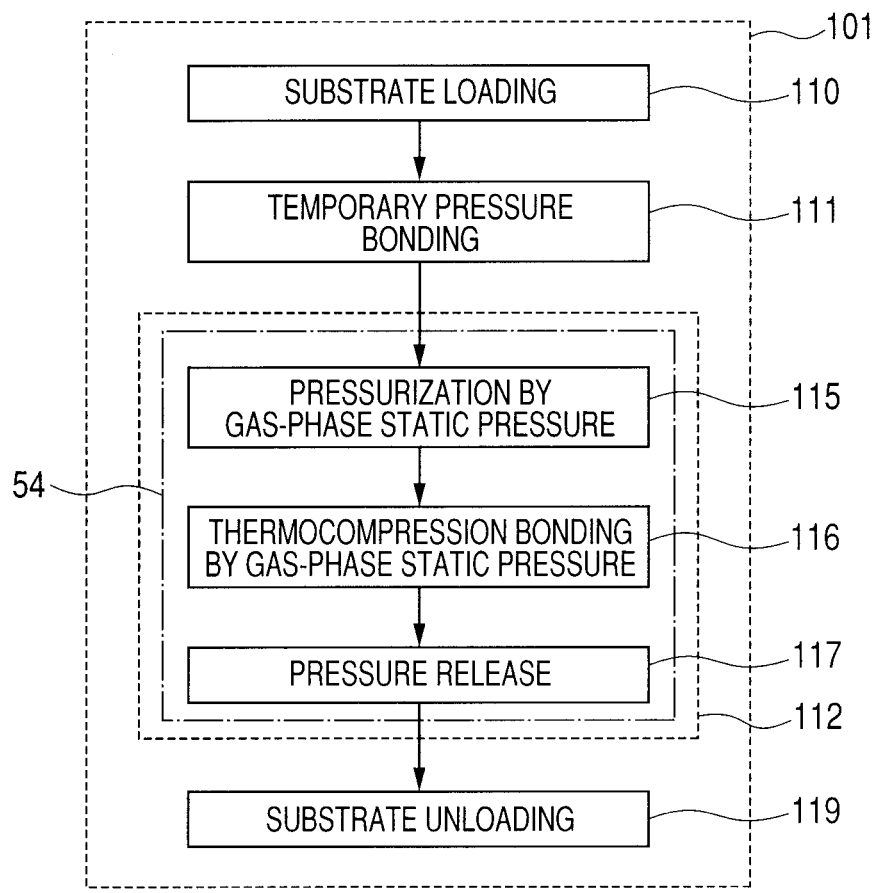

MANUFACTURING METHOD OF SEMICONDUCTOR INTEGRATED CIRCUIT DEVICE

CROSS-REFERENCE TO RELATED APPLICATIONS

The disclosure of Japanese Patent Application No. 2009-94517 filed on Apr. 9, 2009 including the specification, drawings and abstract is incorporated herein by reference in its entirety.

BACKGROUND OF THE INVENTION

The present invention relates to a technique effectively applied to a die bonding technology in a manufacturing method of a semiconductor integrated circuit device (or semiconductor device).

Japanese Patent Laid-Open No. 2009-27054 (Patent document 1) discloses a flip-chip bonding method of curing an adhesive film by applying static gas pressure and heat in a state that the adhesive film is provided over a device surface (front principal surface) having a bump electrode of a semiconductor chip, and in a state that the chip is bonded onto a wiring substrate such that the device surface faces the principal surface of the wiring substrate.

SUMMARY OF THE INVENTION

Recently, in a semiconductor device such as a memory device and a SIP (System in Package) product, device regions (unit device regions) are provided in a matrix on a device mounting surface of a multi-layer organic wiring substrate (so called "substrate product"). Then, a method of laminating and die-bonding semiconductor chips into, for example, a step-like shape (e.g., 2 to 16 layers) in each device region is employed for realizing a higher integration.

In this die bonding, while the rear side of the semiconductor chip is provided with an adhesive layer such as DAF (Die Attach Film), it is necessary to secure the adhesive state of the adhesive layer in the above die bonding process or the following process. This is because a small void in a lower layer might affect an upper layer to make a big void resulting in a pressure bonding failure finally to cause a reflow crack. Accordingly, it is necessary to perform temporary pressure bonding, and then to carry out lamination processing (main pressure bonding) for suppressing the void. In this case, typically, the chip is applied with heat while being pressed down by a pressurization member from above and thereby the hardening of the adhesive is developed.

However, from the analysis by the inventor of the present application, it has become clear that there arise various problems as the chip becomes thinner in the lamination processing of the laminate chips by such a mechanical pressurization method. That is, the problems include chip damage at a part in an overhang state, a chip position shift caused by bending and non-uniform pressurization, and the like. Further, there is another problem that pressure does not work effectively and secure lamination processing cannot be carried out for a lower layer chip without having an upper layer chip. In the case of carrying out only the bonding, similarly a large pressure cannot be applied to the chip in the overhang state. Further, it is necessary to suppress a void caused by a collet suction hole.

The present invention has been achieved for solving these problems.

The present invention has been made in view of the above circumstances and provides a manufacturing process for a high-quality semiconductor integrated circuit device.

The other purposes and the new feature of the present invention will become clear from the description of the present specification and the accompanying drawings.

The following explains briefly the outline of a typical invention among the inventions disclosed in the present application.

That is, one invention of the present application is to carry out lamination processing by static gas pressure after laminating and temporarily pressure-bonding a plurality of semiconductor chips over a circuit substrate in a die bonding process of a substrate product.

The following explains briefly the effect acquired by the typical invention among the inventions disclosed in the present application.

That is, since the lamination processing is carried out by the static gas pressure after laminating and temporarily pressure-bonding a plurality of semiconductor chips over a circuit substrate in a die bonding process of a substrate product, it is possible to apply uniform pressure even when a top layer chip and a lower layer chip are bonded while being shifted from each other.

BRIEF DESCRIPTION OF THE DRAWINGS

FIG. 1 is a process block flow diagram showing a flow of a whole assembly process in a manufacturing method of a semiconductor integrated circuit device in an embodiment of the present application;

FIG. 2 is a process block flow diagram showing details of a die bonding process which is an important part of a manufacturing method of a semiconductor integrated circuit device in an embodiment of the present application;

DETAILED DESCRIPTION OF PREFERRED EMBODIMENTS

[Summary of Embodiments]

Figure 3:
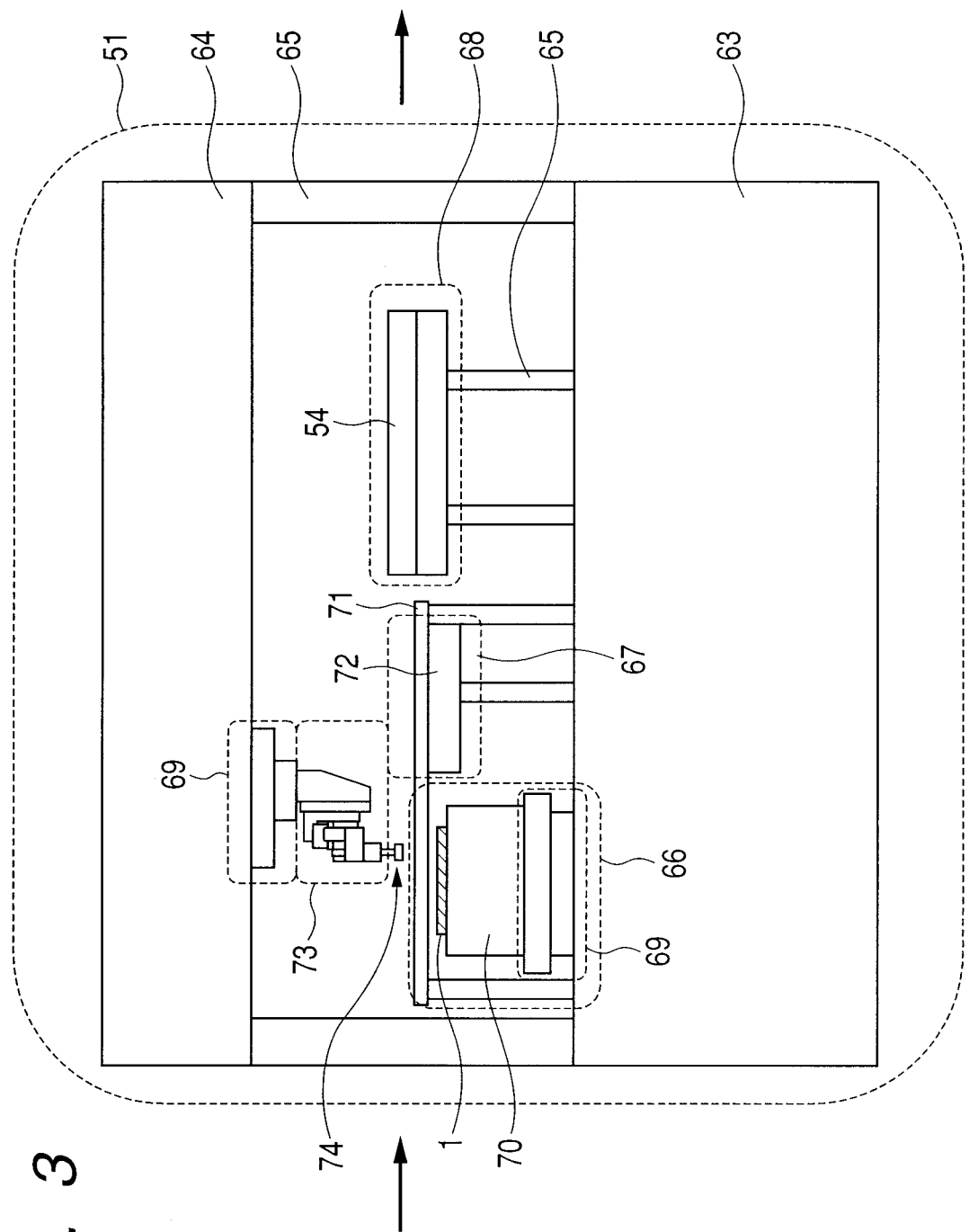
FIG. 3 is a schematic front view of a die bonder used in a manufacturing method of a semiconductor integrated circuit device in an embodiment of the present application.

First, representative embodiments disclosed in the present application will be described.

1. A manufacturing method of semiconductor integrated circuit device comprising the steps of: (a) introducing a circuit substrate having a plurality of device regions over a first principal surface thereof into die bonding equipment; (b) fixing a plurality of chip laminated bodies each having a semiconductor chip in an upper layer and an adhesive layer on a rear side thereof in each of the device regions so as to laminate the chip laminated bodies in respective positions shifted from one another, in the die bonding equipment; and (c) after the step (b), applying uniform static gas pressure onto an exposed surface of each of the chip laminated bodies in a state that each of the chip laminated bodies is heated to a first temperature, in the die bonding equipment.

2. The semiconductor integrated circuit manufacturing method according to the paragraph 1, further comprising the step of, (d) after the step (b) and before the step (c), applying uniform static gas pressure onto the exposed surface of each of the chip laminated bodies in a state that chip laminated body temperature is in a first temperature range lower than the first temperature, in the die bonding equipment.

3. The manufacturing method of semiconductor integrated circuit device according to either the paragraph 1 or the paragraph 2, wherein the adhesive layer is DAF.

4. The manufacturing method of semiconductor integrated circuit device according to any one of the paragraphs 1 to 3, wherein the step (c) is carried out in a state that the chip laminated bodies are accommodated in a single sealed chamber.

5. The manufacturing method of semiconductor integrated circuit device according to any one of the paragraphs 2 to 4, wherein the step (d) is carried out in a state that the chip laminated bodies are accommodated in a single sealed chamber.

6. The manufacturing method of semiconductor integrated circuit device according to the paragraph 5, wherein the step (d) is carried out in a state that the chip laminated bodies are accommodated in the same sealed chamber as that for the step (c).

7. The manufacturing method of semiconductor integrated circuit device according to any one of the paragraphs 1 to 3, wherein the step (c) is carried out in a state that the chip laminated bodies are accommodated in a single sealed chamber together with the circuit substrate.

8. The manufacturing method of semiconductor integrated circuit device according to any one of the paragraphs 1 to 3, wherein the step (d) is carried out in a state that the chip laminated bodies are accommodated in a single sealed chamber together with the circuit substrate.

9. The manufacturing method of semiconductor integrated circuit device according to the paragraph 8, wherein the step (d) is carried out in a state that the chip laminated bodies are accommodated in the same sealed chamber as that for the step (c).

10. The manufacturing method of semiconductor integrated circuit device according to any one of the paragraphs 1 to 9, wherein the chip laminated bodies are accumulated in a step-like shape.

11. The manufacturing method of semiconductor integrated circuit device according to any one of the paragraphs 1 to 10, wherein the static gas pressure is static air pressure.

12. The manufacturing method of semiconductor integrated circuit device according to any one of the paragraphs 1 to 11, wherein a thickness in each of the semiconductor chips is 79 micrometers or less and 5 micrometers or more.

13. The manufacturing method of semiconductor integrated circuit device according to any one of the paragraphs 1 to 11, wherein a thickness in each of the semiconductor chips is 50 micrometers or less and 5 micrometers or more.

14. The manufacturing method of semiconductor integrated circuit device according to any one of the paragraphs 1 to 11, wherein a thickness in each of the semiconductor chips is 30 micrometers or less and 5 micrometers or more.

15. The manufacturing method of semiconductor integrated circuit device according to any one of the paragraphs 1 to 14, wherein the circuit substrate is an organic circuit substrate.

16. The manufacturing method of semiconductor integrated circuit device according to any one of the paragraphs 1 to 15, wherein the adhesive layer contains heat-curable resin as a main component.

17. The manufacturing method of semiconductor integrated circuit device according to any one of the paragraphs 1 to 16, wherein the step (b) is carried out in a state that temperature of the semiconductor chip is within the first temperature range.

18. The manufacturing method of semiconductor integrated circuit device according to any one of the paragraphs 1 to 17, wherein the first temperature is from 70 to 160° C.

19. The manufacturing method of semiconductor integrated circuit device according to any one of the paragraphs 1 to 18, wherein the first temperature range is from a room temperature to 100° C.

20. The manufacturing method of semiconductor integrated circuit device according to any one of the paragraphs 1 to 18, wherein the first temperature range is from 60 to 100° C.

[Explanation of a Description Format and a Basic Term and Usage in the Present Application]

1. While the description of the embodiment is sometimes divided as needed into a plurality of sections for convenience in the present application, these divided descriptions are not independent or different from one another, but they are respective parts of one example, one of them is partial details of another one, or they are modifications or the like of a part of or a whole of the embodiment, except when it is explicitly indicated in particular that this is not the case. Further, in principle, repeated explanation is omitted for the same part. In addition, each constituent of the embodiment is not essential except when it is explicitly indicated in particular that this is not the case, except when the number of the constituents is determined theoretically, and except when it is clear from a context that this is not the case.

Further, in the present application, the "semiconductor integrated circuit device" means a device mainly integrating various transistors (active elements) in particular together with a resistor, a capacitor, and the like (e.g., a single crystal silicon substrate) over a semiconductor chip or the like.

2. Similarly in the description of the embodiments, even when a material, a composition, or the like is described as "X composed of A" or the like, a material, a composition, or the like including an element except A as a constituent is not excluded except when it is explicitly indicated in particular that this is not the case, and except when it is clear from a context that this is not the case. For example, the above expression means "X including A as a main component" for the composition. Obviously, "silicon material" or the like, for example, is not limited to pure silicon, but includes also a SiGe alloy and a multi-component alloy containing silicon as a main component, and further includes also a silicon material containing another additive or the like.

3. Similarly for shape, a position, an attribute, or the like, while they are illustrated with respective preferable examples, obviously each of them is not limited strictly to the preferable example except when it is explicitly indicated in particular that this is not the case and except when it is clear from a context that this is not the case.

4. Further, when a specific numerical value or amount is mentioned, the numerical value or amount may be a numerical value exceeding the specific numerical value or a numerical value smaller than the specific numerical value except when it is explicitly indicated in particular that this is not the case, except when the numerical value is limited to the specific numerical value theoretically, and except when it is clear from a context that this is not the case.

5. While usually a "wafer" indicates a single crystal silicon wafer on which the semiconductor integrated circuit device (also, semiconductor device and electronic device) is formed, a "wafer" obviously includes an epitaxial wafer, an SOI substrate, an insulating substrate such as an LCD glass substrate, a composite wafer of semiconductor layers, and the like. In the present application, not only a wafer before being separated into individual chips, but a wafer separated by dicing or the like and attached to a dicing tape or the like is sometimes also called a "wafer".

6. Air pressure is expressed on the basis of the standard air pressure, that is, $1.013 \times 10^5$ Pa.

[Details of the Embodiments]

Details of the embodiments will be described further. In each of the drawings, the same or a similar part is indicated by the same or a similar symbol or reference number and explanation will not be repeated in principle.

Further, in the accompanying drawings, hatching or the like is omitted even from a cross section when the drawing is made complicated on the contrary or when the cross section is clearly divided from a vacant space. In a related matter, an outline in the back is sometimes omitted even from a hole closed in a planar view when this is clear in explanation or the like. Moreover, hatching is provided even for a part which is not a cross section in order to show the part is not a vacant space.

Note that chip detaching in the die bonding, that is, details of a pickup process or the like are described in patent documents by the present inventor and others: Japanese Patent Application No. 2008-299643 (applied on Nov. 25, 2008), Japanese Patent Application No. 2008-137631 (applied on May 27, 2008), Japanese Patent Application No. 2008-099965 (applied on Apr. 8, 2008), and corresponding US Patent Disclosure No. 2008-0318346 (disclosed on Dec. 25, 2008), and explanation about these parts will not be repeated as a general rule in the present application except when they are required in particular.

1. Explanation of a die bonder and the like used for a manufacturing method of semiconductor integrated circuit device in an embodiment of the present application (mainly from FIG. 3 to FIG. 6)

FIG. 3 is a schematic front view of a die bonder 51 used for a manufacturing method of semiconductor integrated circuit device in an embodiment of the present application.

First, an outline of an important part of the die bonder used for the manufacturing method of semiconductor integrated circuit device in an embodiment of the present application will be described by the use of FIG. 3. As shown in FIG. 3, a housing of the die bonder 51 (die detaching & bonding equipment) is configured with a lower base body 63, an upper base body 64, a support pillar 65 connecting the base bodies, and the like. A wafer holder X-Y table 69 is provided in a chip detaching part 66 on this lower base body 63, and a wafer holder 70 holding a wafer 1 (typically, wafer already divided into individual chips) is mounted on the X-Y table 69.

Meanwhile, a die bonding head X-Y table 69 is provided on the lower plane of the upper base body 64 and a die bonding head 73 is attached to this X-Y table 69. Further, at the lower end of the die bonding head 73, a suction collet 74 (chip holding part) is provided for vacuum-sucking or the like of a semiconductor chip 2 (FIG. 4).

Further, a pair of substrate carrying paths 71 is provided for carrying the circuit substrate 3 at a rear part on the upper surface of the lower base body 52, and a die bonding stage 72 is provided at a temporary pressure bonding part 67 therebetween for carrying out the die bonding (temporary pressure bonding).

Further, a static pressure applying part (main thermocompression bonding part) 68 is provided with a static pressure applying chamber (lamination processing chamber) 54 which is a sealed box to be opened and closed.

Figure 4:
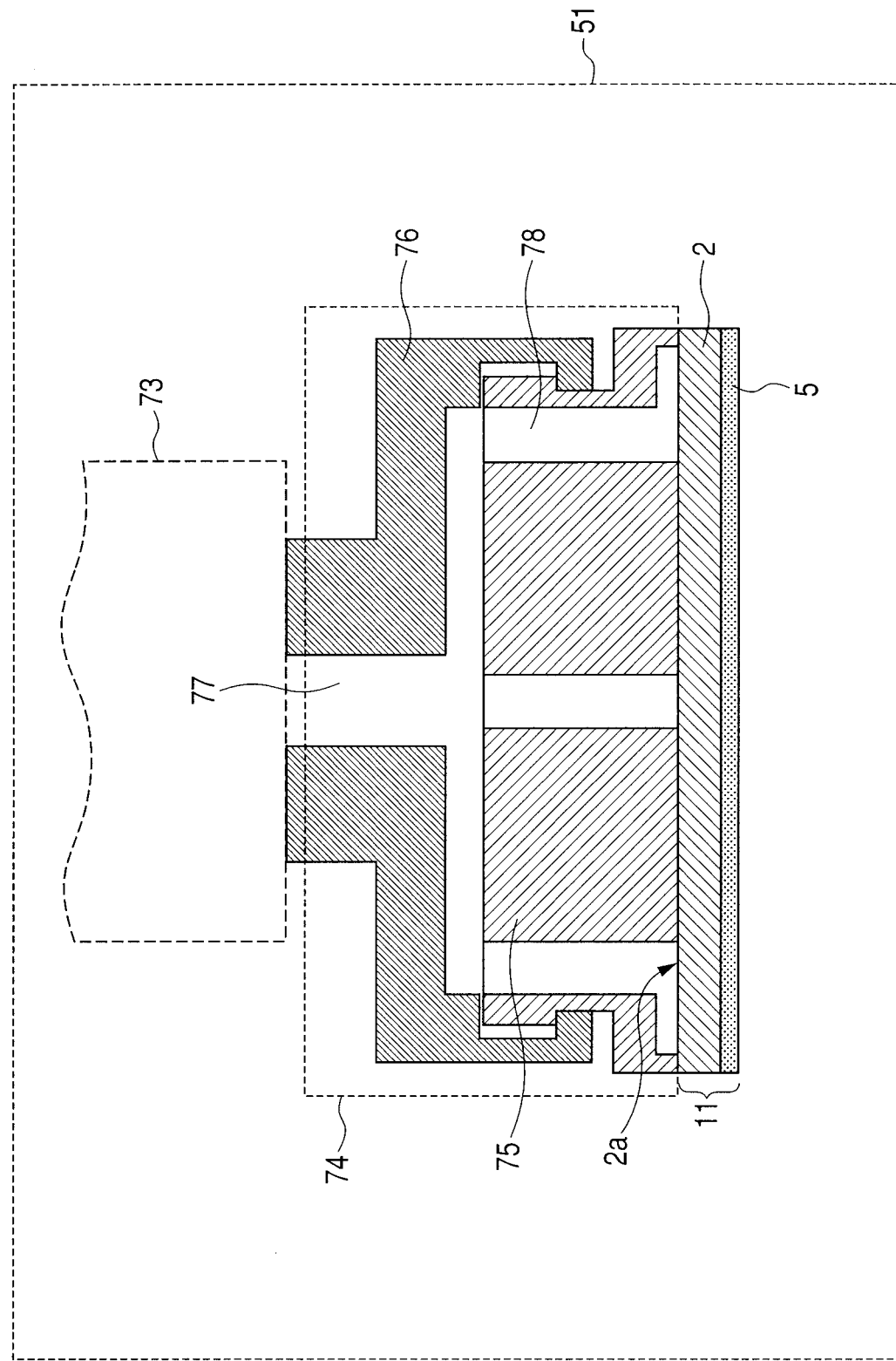
FIG. 4 is a cross-sectional view showing a structure of a suction collet provided in the bottom part of a die bonding head in the die bonder of FIG. 3.

FIG. 4 is a cross-sectional view showing a structure of the suction collet 74 provided at the lower end of the die bonding head in the die bonder of FIG. 3. As shown in FIG. 4, the suction collet 74 is configured with a rubber chip holder 76 composed of an upper part metal and the like, a rubber chip 75 attached to the lower part thereof, and the like, for example, and vacuum suction holes 77 and 78 are provided in the respective insides thereof for vacuum-sucking the upper surface 2a (device surface) of the semiconductor chip 2. This rubber chip 75 can be exemplified with a material containing elastomer such as a heat-curable rubber having a Shore A hardness of approximately 50, for example, as a main component. (A thermoplastic rubber or the like may be used. However, the heat-curable material is more unsusceptible to heat effect.) Further, a preferable hardness range can be exemplified with a range from 30 to 70. Note that almost whole of the suction collet 74 may be made of a hard metal or the like. However, the use of the rubber chip 75 as shown here is generally preferable for a die bonding characteristic such as a void.

An adhesive layer 5, that is, DAF (Die Attach Film) is formed over the lower surface of the semiconductor chip 2, and a chip laminated body 11 is configured with the semiconductor chip 2, the adhesive layer 5 (thickness is approximately 20 micrometers, for example), and the like.

Figure 5:
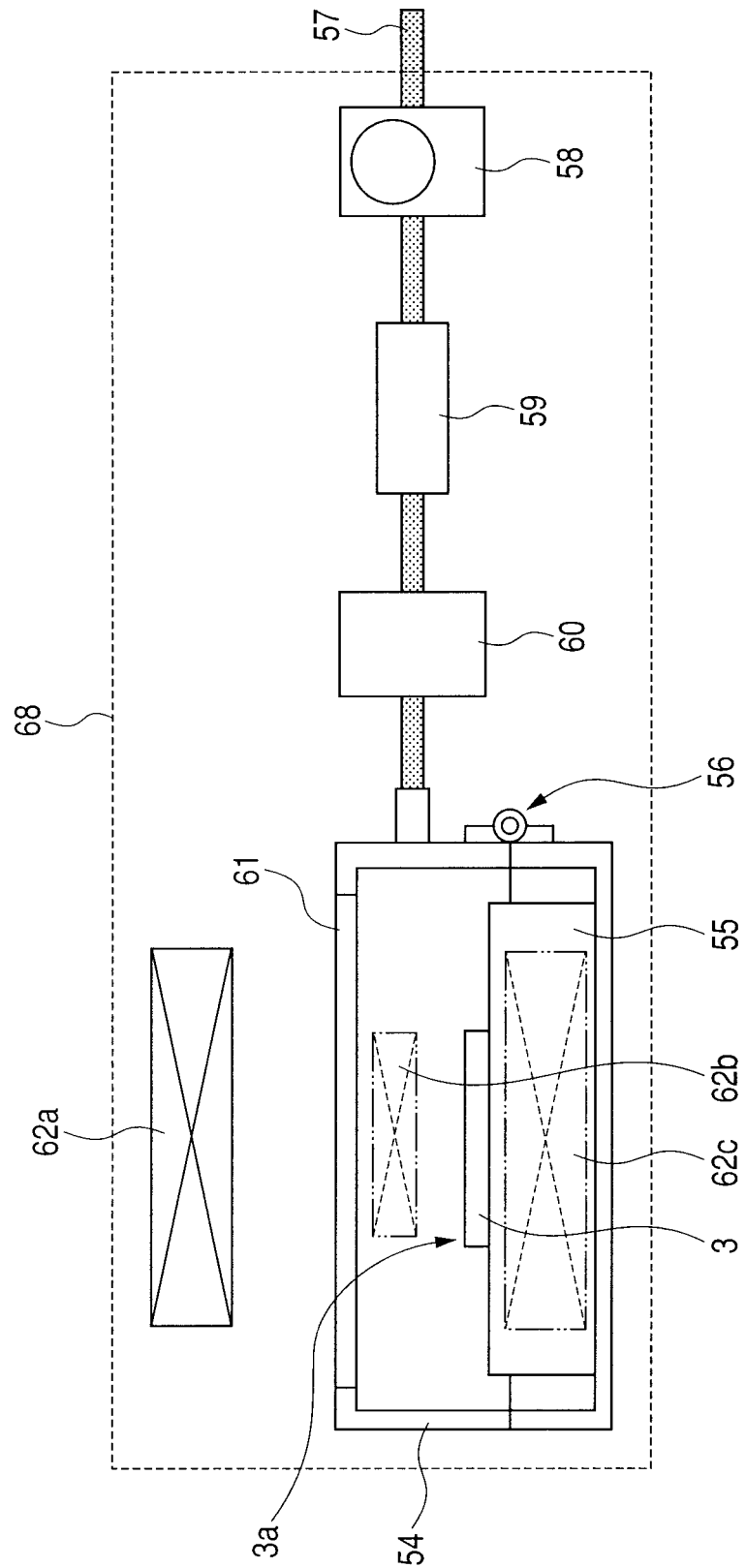
FIG. 5 is a side cross-sectional view of a static pressure applying part (main thermocompression bonding part) of the die bonder of FIG. 3.
Figure 6:
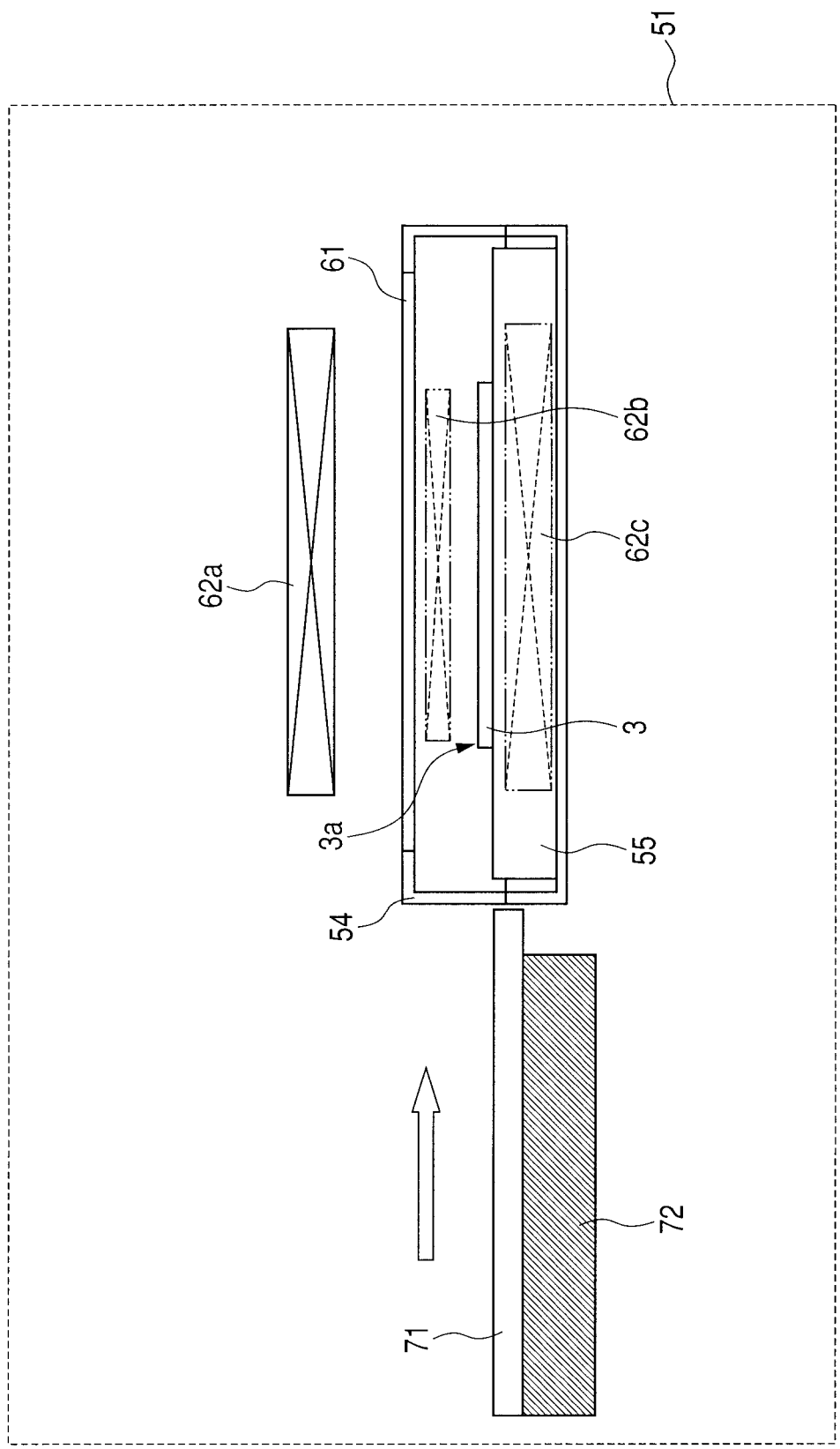
FIG. 6 is a front cross-sectional view of a periphery of a static pressure applying chamber (lamination processing chamber) in a static pressure applying part (main thermocompression bonding part) of the die bonder of FIG. 3.

FIG. 5 is a side cross-sectional view of the static pressure applying part (main thermocompression bonding part) in the die bonder of FIG. 3, and FIG. 6 is a front cross-sectional view of a periphery of the static pressure applying chamber 54 (lamination processing chamber) in the static pressure applying part 68 (main thermocompression bonding part) for the die bonder of FIG. 3. As shown in FIG. 5 and FIG. 6, within the static pressure applying chamber 54 there is provided a circuit substrate stage 55 for holding a circuit substrate (organic multi-layer wiring substrate) 3 so as to direct the device surface 3a thereof upward. Further, for a mechanism of heating the circuit substrate 3, more specifically the semiconductor chip 2, either one of far-infrared heaters 62a, 62b has an advantage in speed, while there are various variations. For the disposition of these heaters, there are a method of disposing the far-infrared heater 62a outside a transparent window 61 provided on the upper plane of the static pressure applying chamber 54 as the outside far-infrared heater 62a and a method of disposing the far-infrared heater 62b within the static pressure applying chamber 54 as the inside far-infrared heater 62b. Of these far-infrared heaters, the outside far-infrared heater 62a has an advantage in a temperature drop speed. Moreover, there is a simple method of disposing a heat block 62c inside or in the lower part or the like of the circuit substrate stage 55.

The static pressure applying chamber 54 can be opened and closed by a static pressure applying chamber opening/closing mechanism 56 and can input and eject the circuit substrate 3, and the inside from the static pressure applying chamber opening/closing mechanism 56 can be set at a desired air pressure by an air pressure regulator 58 (for setting a required maximum air pressure) coupled with a pressurization air supply 57 (high pressure air supply), an electro-magnetic on-off valve 59 (controlling opening and closing electrically), an electropneumatic regulator (automatic pressure regulation electro-magnetic valve with a pressure sensor) 60, etc. Here, the electropneumatic regulator 60 maintains the inside of the operating static pressure applying chamber 54 in a predetermined pressurization state by repeating ON/OFF according to the pressure sensor on the output side.

2. Explanation for an outline of an assembly process in a manufacturing method of semiconductor integrated circuit device in an embodiment of the present application (mainly, FIG. 1, FIG. 2, and FIG. 8 to FIG. 17)

FIG. 8 to FIG. 17 and the like show an example of a micro SD, which is approximately 29.1 millimeters long and 19.2 millimeters wide, and, when the micro SDs are laminated in a step-like shape, the chip disposition error tends to be accumulated in proportion to the number of laminated layers. Currently, the number of the laminated layers has been increased and a high accumulation structure having approximately 16 laminated layers has become popular, and thereby an improved die bonding accuracy is being further required. This requirement for the positional accuracy improvement is the same for a MAP (Mold Array Process) and the like, not limited to the micro SD. Further, this is an important subject generally for a laminate product not limited to the step-like laminate.

Here, the assembly process including the die bonding process will be described by the use of FIG. 1, FIG. 2, and FIG. 8 to FIG. 17. First, a die bonding process 101 in FIG. 1 will be described. This process is carried out within the die bonding equipment 51 explained in FIG. 3.

Figure 8:
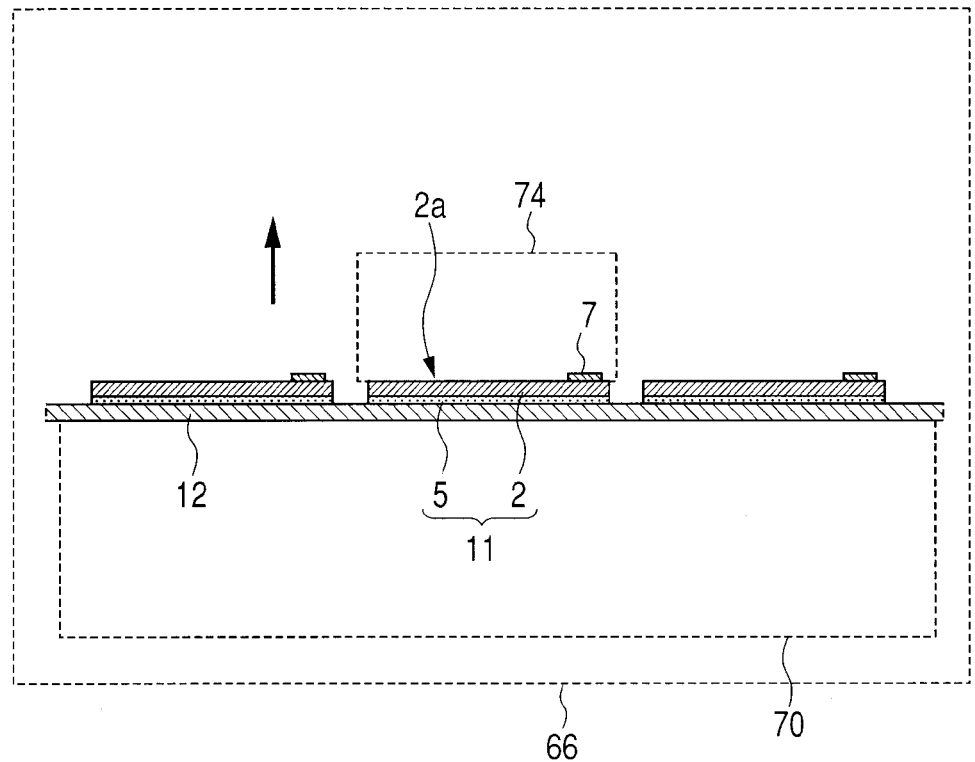
FIG. 8 is a schematic cross-sectional flow diagram of a device and equipment (collet landing for pealing) showing a detaching process on a wafer stage (chip detaching stage) of a chip detaching part in the die bonder of FIG. 3.

First, as shown in FIG. 2, the circuit substrate 3 is loaded in the die bonding equipment 51 (substrate loading step 110). Next, as shown in FIG. 2, the circuit substrate 3 is moved onto a temporary pressure bonding stage 72 and the temporary pressure bonding processing 111 is carried out. That is, as shown in FIG. 8, the suction collet 74 (more precisely, lower plane of the rubber chip 75 in FIG. 4) is caused to land on the device surface 2a of a target chip 2 for detaching the target chip from the a plurality of chips 2 adhering onto a dicing tape 12 which is vacuum-sucked to the wafer stage (chip detaching stage) 70 in the chip detaching part 66 of the die bonding equipment 51. Note that the device surface 2a of the chip 2 is provided with a bonding pad 7 of aluminum-based and the like, for example.

Figure 9:
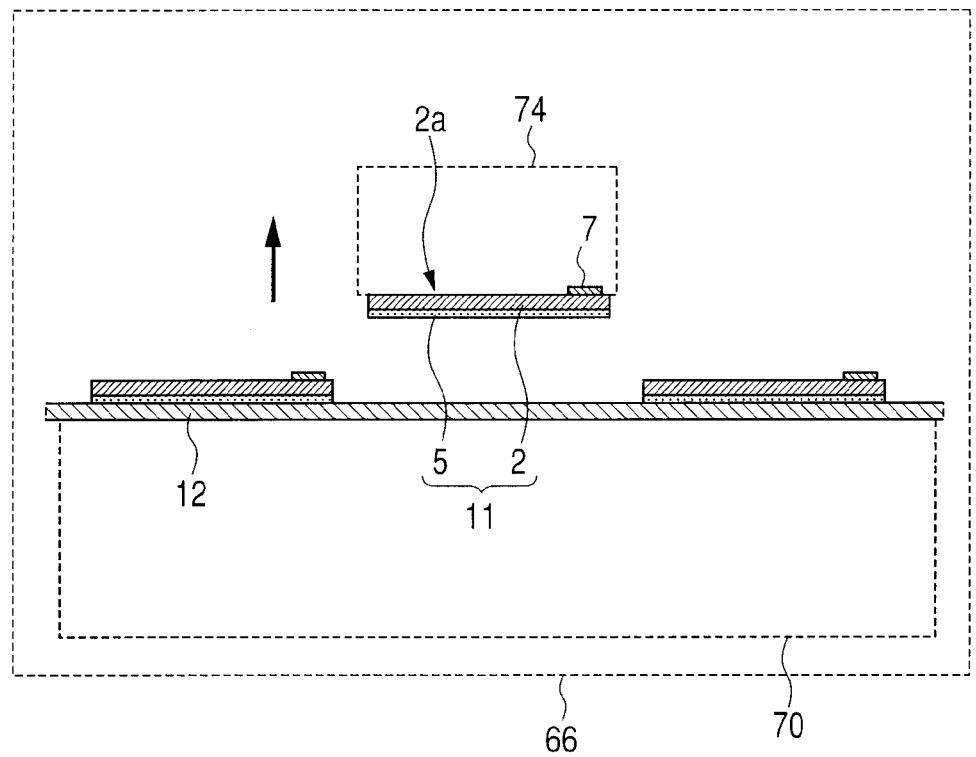
FIG. 9 is a schematic cross-sectional flow diagram of a device and equipment (detaching completion) showing a detaching process on a wafer stage (chip detaching stage) of a chip detaching part in the die bonder of FIG. 3.

Next, as shown in FIG. 9, the suction collet 74 is elevated and the chip 2 is detached from the dicing tape 12 completely. More precisely, the chip laminated body 11 composed of the semiconductor chip 2, the adhesive layer 5, and the like is detached from the dicing tape 12 completely.

Figure 10:
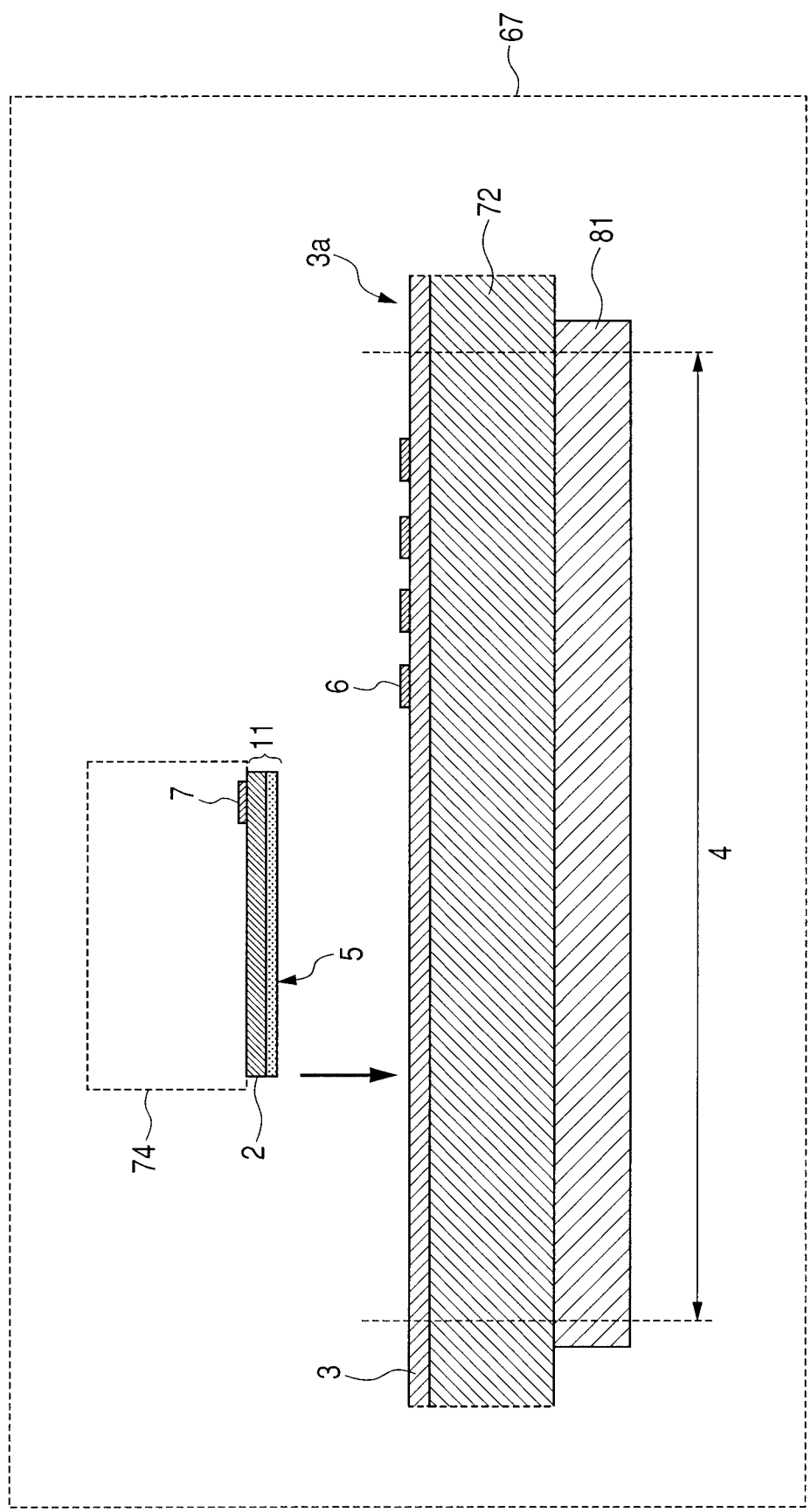
FIG. 10 is a schematic cross-sectional flow diagram of a device and equipment (collet descending for die bonding) showing a temporary pressure bonding process on a temporary pressure bonding stage of a temporary pressure bonding part in the die bonder of FIG. 3.

Next, as shown in FIG. 10, the suction collet 74 holding the chip laminated body 11 descends toward the wiring substrate 3 disposed on the temporary pressure bonding stage 72 of the temporary pressure bonding part 67 along with the movement of the die bonding head 73 (FIG. 3). A plurality of external leads 6 and the like are provided in the individual device region 4 (unit device region) on the device surface 3a of the wiring substrate 3. Note that, the lower part or the inside of the temporary pressure bonding stage 72 is provided with a heating mechanism such as the heat block 81, and can be heated and maintained in a temperature range from a room temperature to approximately 160° C. (temperatures is indicated by a setting temperature of the heat block). Typically, this temporary pressure bonding process is preferably carried out in a temperature range from a room temperature range (15 to 35° C.) to 100° C. from a viewpoint of the heat history of the adhesive layer 5 and the like. Further, when the temperature exceeds 100° C., the temperature becomes close to a glass transition temperature (approximately 130° C.) of glass epoxy which is a universal substrate material (in the case of organic circuit substrate) and thereby causes a problem such as increased thermal stress. Further, for flexibly accommodating various kinds of adhesive material, the lower limit of temperature range for the temporary pressure bonding is sometimes appropriately set to be 60 or 70° C. Here, the setting temperature of the heat block 81 is set to be approximately 80° C., for example (preferable range is a range approximately from 60 to 100° C.). Obviously, when these problems matter little, the temperature may be set in a wider range approximately from the room temperature to 160° C.

Figure 11:
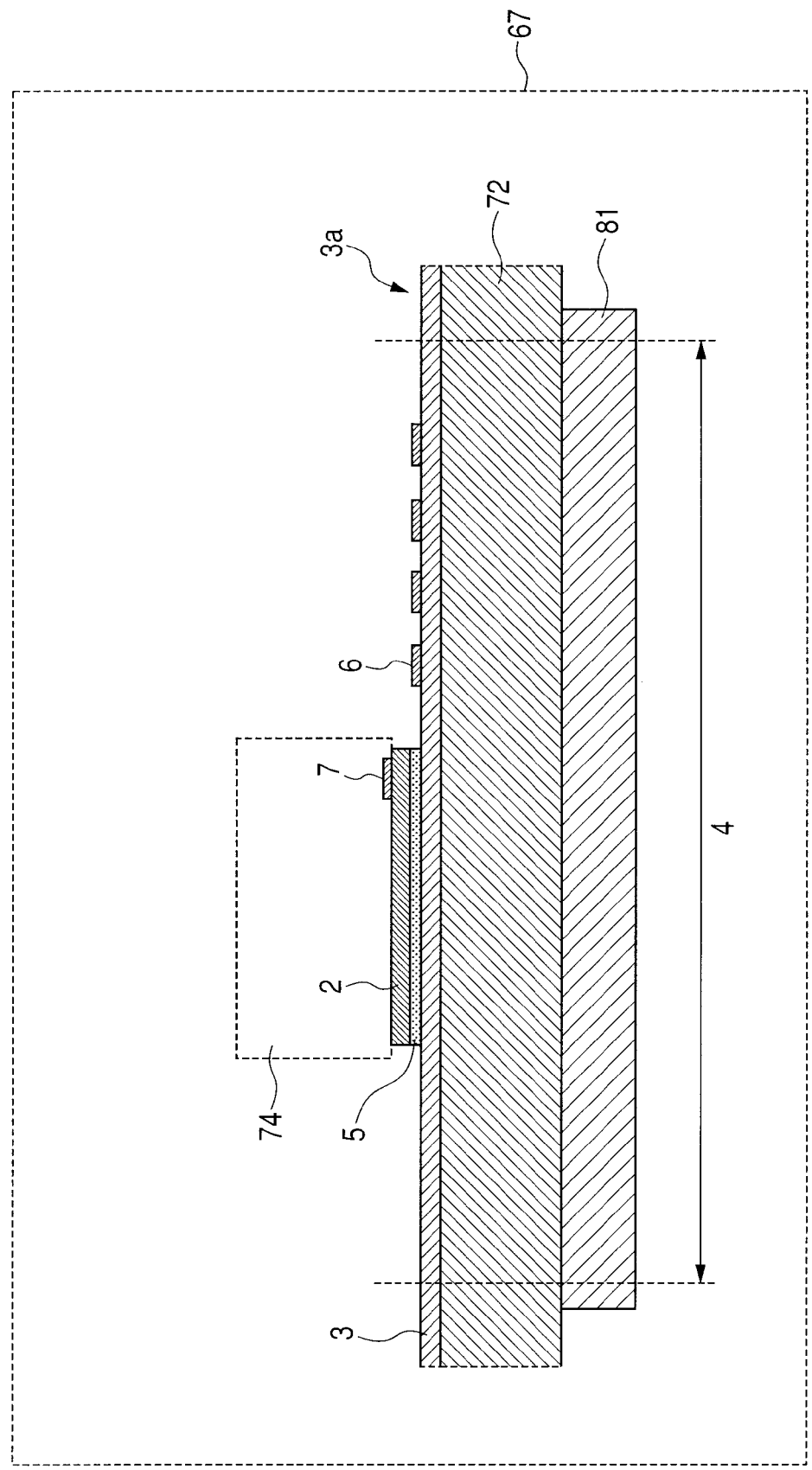
FIG. 11 is a schematic cross-sectional flow diagram of a device and equipment (collet landing for die bonding) showing a temporary pressure bonding process on a temporary pressure bonding stage of a temporary pressure bonding part in the die bonder of FIG. 3.

Next, as shown in FIG. 11, the suction collet 74 holding the chip laminated body 11 lands onto the device surface 3a of the wiring substrate 3 on the temporary pressure bonding stage 72 which is heated and maintained at a temperature of approximately 80° C. by the heat block 81, and bonding load is maintained in this state for a certain time. The bonding load is, for example, approximately 0.1 megapascals (preferable range is from 0.05 to 0.2 magapascals) and the maintaining time (load application time) is, for example, approximately one second (preferable range is approximately from 0.05 to 2 seconds).

Figure 12:
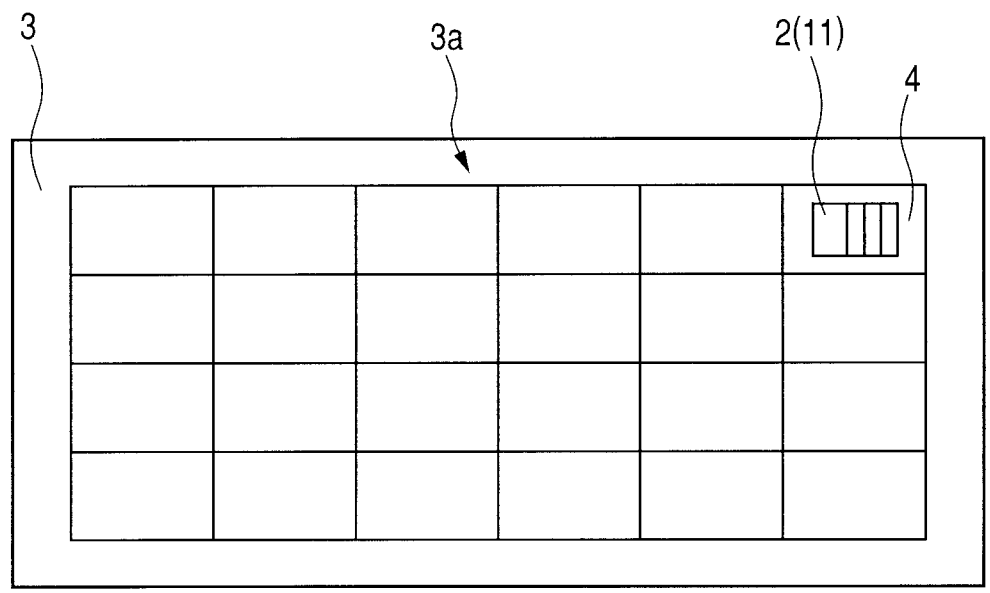
FIG. 12 is a top view of a circuit substrate (when chips are laminated and fixed in the first device region) showing a temporary pressure bonding process on a temporary pressure bonding stage of a temporary pressure bonding part in the die bonder of FIG. 3.
Figure 13:
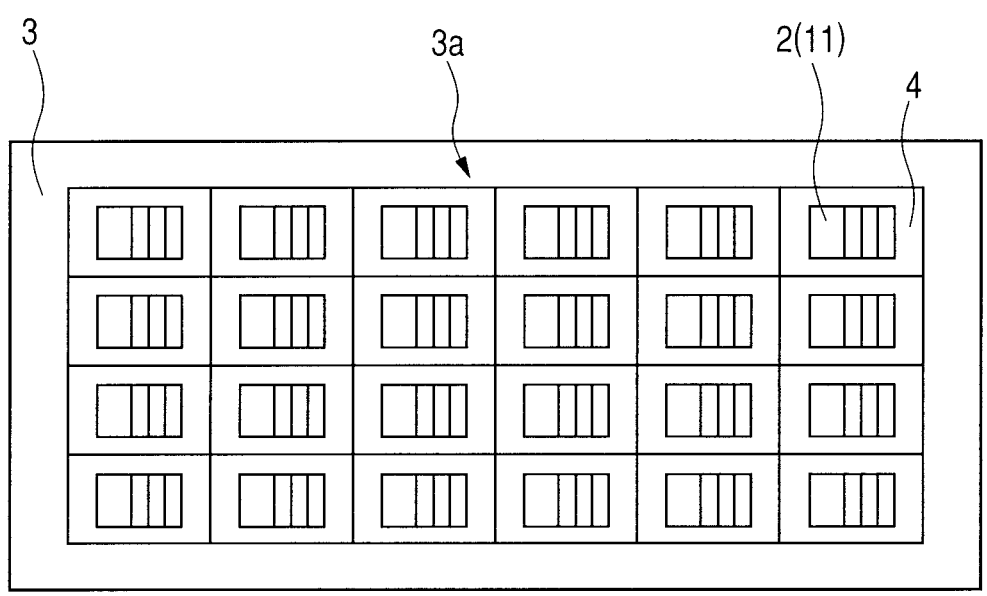
FIG. 13 is a top view of a circuit substrate (when chips are laminated and fixed in all device regions) showing a temporary pressure bonding process on a temporary pressure bonding stage of a temporary pressure bonding part in the die bonder of FIG. 3.

As shown in FIG. 12, a predetermined number (here, four but typically a number selected as needed from approximately two to ten) of lamination layers are laminated in the first device region 4 by the repetition of such a detaching and die bonding process, and then the temporary pressure bonding of a predetermined number of lamination layers is shifted sequentially to another device region 4 (typically, neighboring device region) as shown in FIG. 13, and similarly carried out by repeating the detaching and die bonding process, and, finally the lamination and temporary pressure bonding are completed for all the device regions 4 to be processed.

Figure 14:
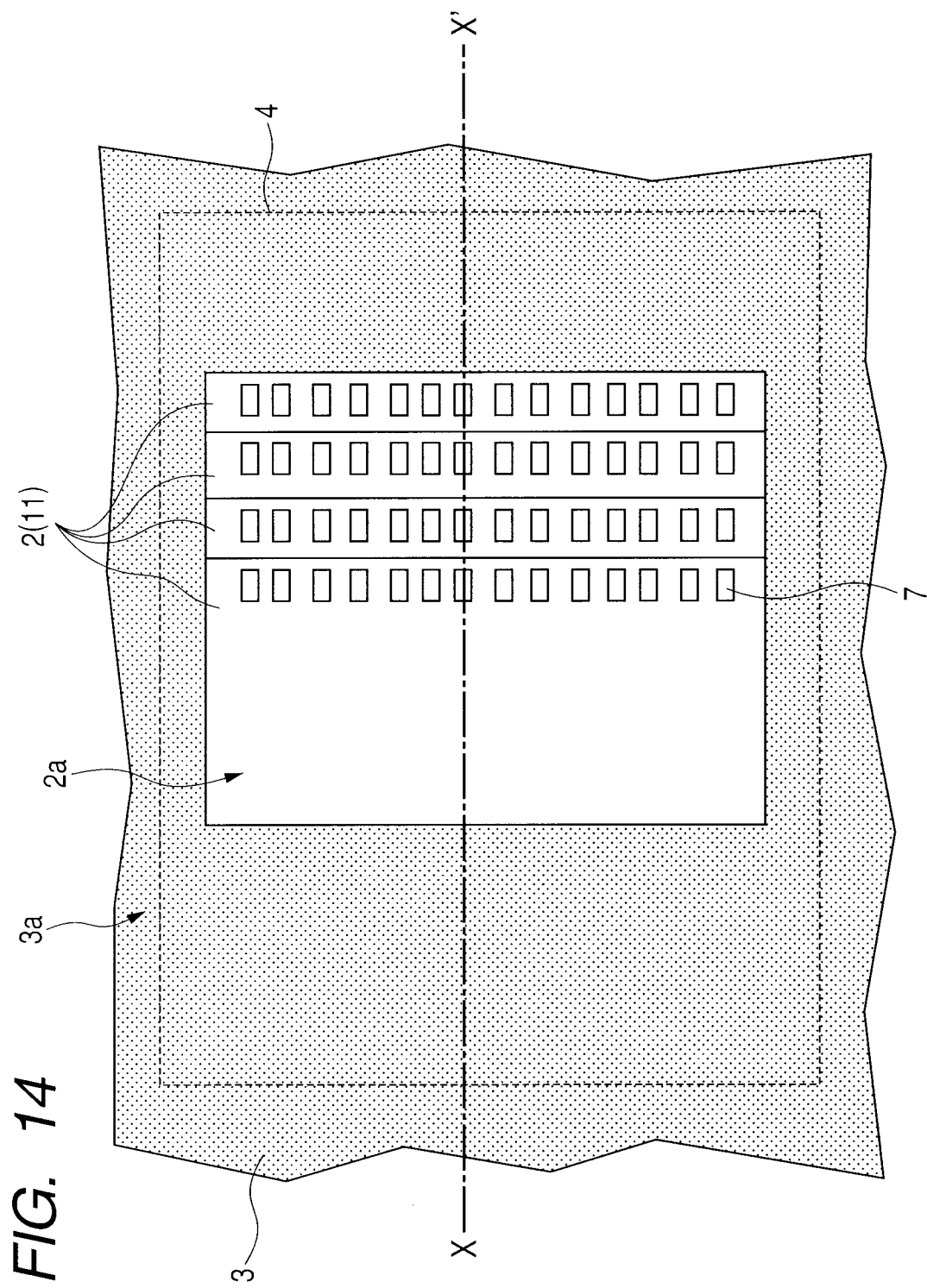
FIG. 14 is an enlarged view of each device region in FIG. 13 (pattern on a circuit substrate is omitted)
Figure 15:
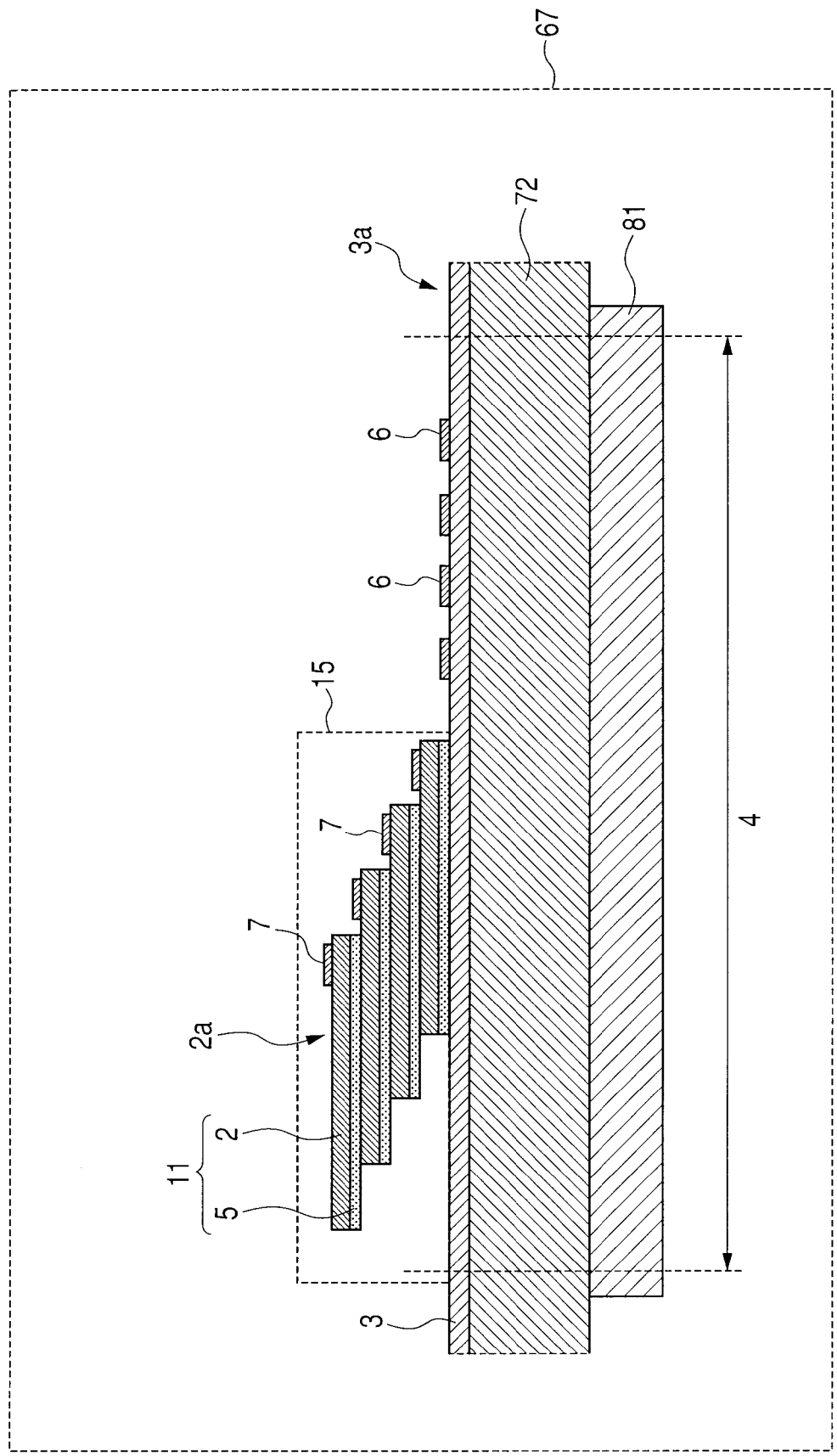
FIG. 15 is a schematic cross-sectional flow diagram of a device and equipment (when chip lamination is completed for the first lamination unit) showing a temporary pressure bonding process on a temporary pressure bonding stage of a temporary pressure bonding part in the die bonder of FIG. 3.

FIG. 14 is an enlarged view of each of the device region 4 in FIG. 13 (circuit substrate pattern is omitted), and FIG. 15 is a schematic cross-sectional view of a device and equipment corresponding to a cross section X-X' of FIG. 14. It is apparent that the semiconductor chips 2 (chip laminated bodies 11) belonging to the first lamination unit 15 are laminated in a step-like shape. When the lamination of the semiconductor chips 2 (chip laminated body 11) belonging to the first lamination unit 15 has been completed, the process is moved to the main pressure bonding processing (lamination processing) 112 (FIG. 2), but the main pressure bonding processing (lamination processing) 112 will be described in Section 3 and the subsequent process will be described here.

Figure 16:
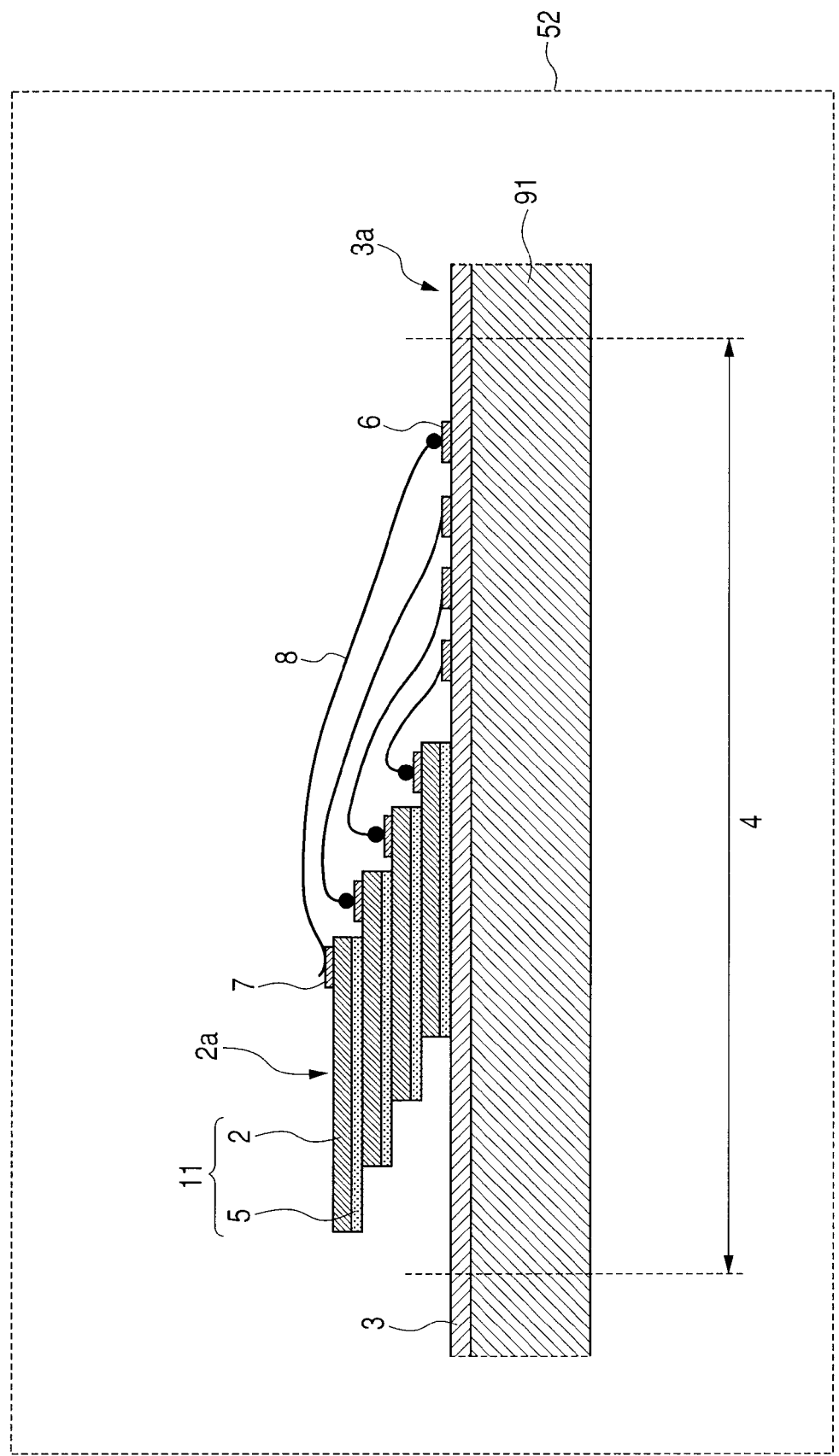
FIG. 16 is a schematic cross-sectional flow diagram of a device and equipment (when wire bonding is completed after the chip lamination for the first lamination unit) subsequent to that in FIG. 15 showing a wire bonding process on a wire bonding stage in a wire bonder.

When the main pressure bonding processing (lamination processing) 112 has been completed (die bonding process 101 has been completed), as shown in FIG. 1, the wiring substrate 3 is unloaded (substrate unloading step 119 in FIG. 2) and transferred to wire bonding equipment 52. A wire bonding process 102 is carried out as shown in FIG. 16. Here, a wire 8 is a gold-based bonding wire, for example. Note that the bonding wire may be also a cupper-based or aluminum-based bonding wire.

Figure 17:
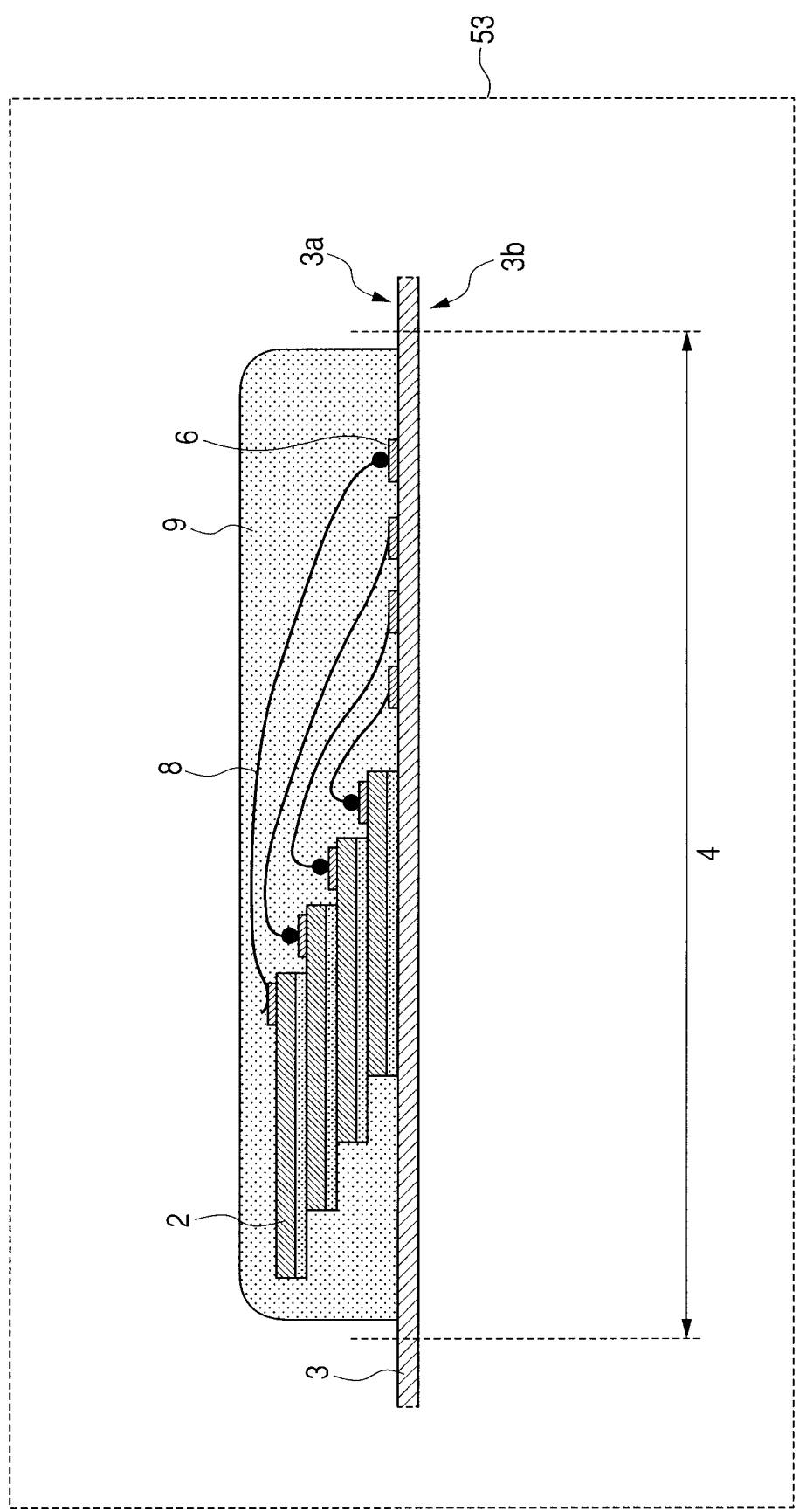
FIG. 17 is a schematic cross-sectional flow diagram of a device subsequent to that of FIG. 16 showing a state sealed with resin within resin sealing equipment.

After the completion of the wire bonding process 102, as shown in FIG. 1, the wiring substrate 3 is transferred to resin sealing equipment 53 and a sealing process 103 is carried out as shown in FIG. 17. Here, a resin sealing body (sealing resin part) 9 contains an epoxy-based resin as a main component, for example.

3. Detailed explanation of the die bonding process which is an important part of a manufacturing method of semiconductor integrated circuit device in an embodiment of the present application (mainly, FIG. 1, FIG. 2, FIG. 3, FIG. 5 to FIG. 7, FIG. 15, and FIG. 18).

Figure 7:
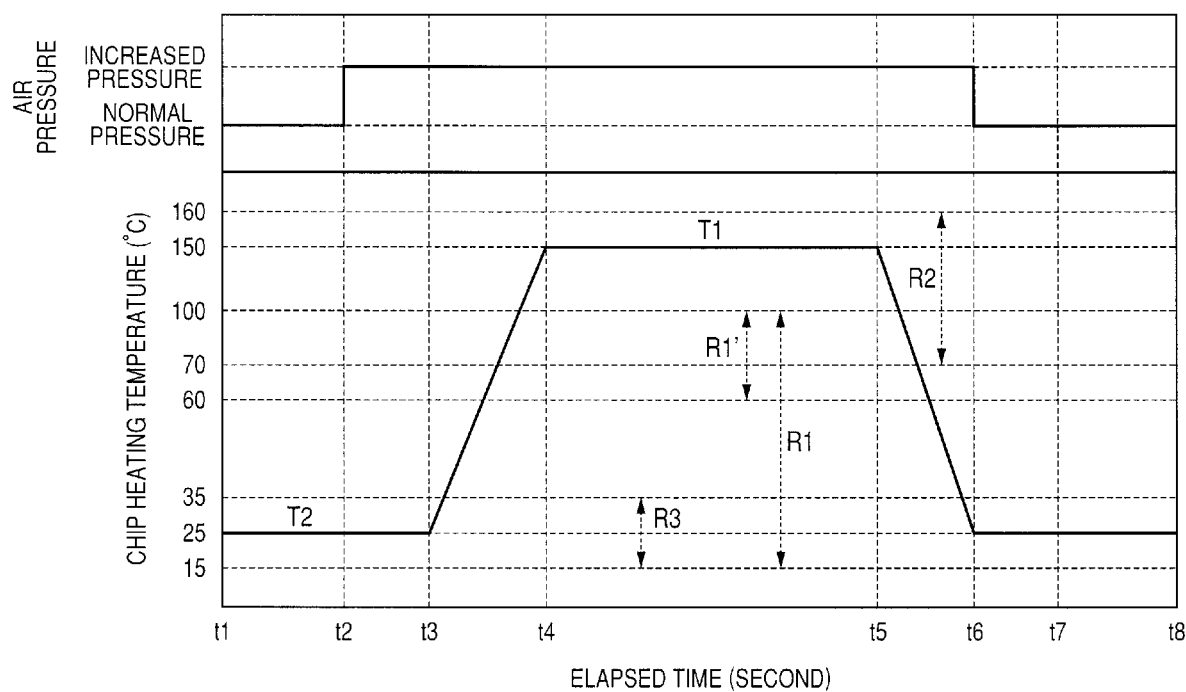
FIG. 7 is a detailed process sequence diagram showing an example of a process sequence for the main pressure bonding processing (lamination processing) of FIG. 2.

FIG. 2 is a process block flow diagram showing details of the die bonding process which is an important part of a manufacturing method of semiconductor integrated circuit device in an embodiment of the present application. FIG. 7 is a detailed process sequence diagram showing an example of a process sequence in the main pressure bonding processing (lamination processing) of FIG. 2. This section will describe the main pressure bonding processing (lamination processing) 112 (FIG. 2) in the die bonding process 101 of FIG. 1 described in Section 2.

As shown in FIG. 2, FIG. 5, FIG. 6 (here, explanation will be provided for the case that only the outside far-infrared heater 62a and the heat block 62c exist as the heating mechanism), and FIG. 7, after the completion of the temporary pressure bonding processing 111, the static pressure applying chamber 54 is opened to accept the circuit substrate 3 onto the circuit substrate stage 55 thereof and the static pressure applying chamber 54 is closed at time t1. The time from t1 to the following t2 is approximately five seconds, for example.

Next at time t2, pressurization in the static pressure applying chamber 54 comes into an ON state, and the state is maintained until time t3 (step 115 of pressurization by gas phase static pressure). At this time, the setting temperature of the circuit substrate stage 55 (gas phase static pressure pressurization temperature T2 or main thermocompression bonding pre-processing temperature) is set to be a room temperature (approximately 25° C.), for example. This time from t2 to t3 is approximately two seconds, for example (a preferable range can be exemplified as a range approximately from one to ten seconds). Note that the air pressure of the static pressure applying chamber 54 in the ON state for pressurization is approximately 0.2 megapascals, for example (same for the following On state). A preferable range can be exemplified as a range approximately from 0.05 to 0.6 megapascals. Note that, while the gas phase static pressure pressurization temperature T2 is preferably to be in a room temperature range, that is, a temperature range of approximately from 15 to 35° C. from a viewpoint of the thermal history of the adhesive layer 5, generally the gas phase static pressure pressurization is preferably carried out in a first temperature range R1' (comparatively high temperature range) approximately from 60 or 70° C. to 100° C. for accommodating various adhesives. Accordingly, a first temperature range R1 applicable to the gas phase static pressure pressurization temperature T2 can be exemplified as a range approximately from 15 to 100° C. in a case in which the characteristic of the adhesive is sufficiently taken into consideration.

Next, at time t3, the outside far-infrared heater 62a comes into an ON state to start increasing the temperature of each semiconductor chip 2 on the circuit substrate 3 and causes the temperature of each semiconductor chip 2 to reach the first temperature T1 (lamination temperature or main pressure bonding temperature) at time t4. This time from t3 to t4 is approximately five seconds, for example. The lamination temperature is approximately 150° C., for example. A preferable range can be exemplified as a range approximately from 70 to 160° C.

Next, this state is maintained until time t5 (step 116 of thermocompression bonding by gas phase static pressure). This time from t4 to t5 (main thermocompression bonding processing time) is approximately eight seconds, for example. A preferable range of this main thermocompression bonding processing time can be exemplified as a range approximately from 2 to 60 seconds.

Next, at time t5, the outside far-infrared heater 62a is turned off, and the temperature in each of the semiconductor chips 2 starts dropping and decreases to the same temperature as the gas phase static pressure pressurization temperature (main thermocompression bonding pre-processing temperature) T2 at time t6. This time from t5 to t6 is approximately three seconds, for example.

Then, approximately at the same time as the time t6, the pressurization in the static pressure applying chamber 54 comes into an OFF state (normal pressure) (pressure release 117), and, at time t7, the static pressure applying chamber 54 opens and starts discharging the circuit substrate 3 to the outside of the static pressure applying chamber 54. This time from t6 to t7 is approximately two seconds, for example.

Next, at time t8, the discharging of the circuit substrate 3 from the static pressure applying chamber 54 is completed. This time from t7 to t8 is approximately five seconds, for example.

Figure 18:
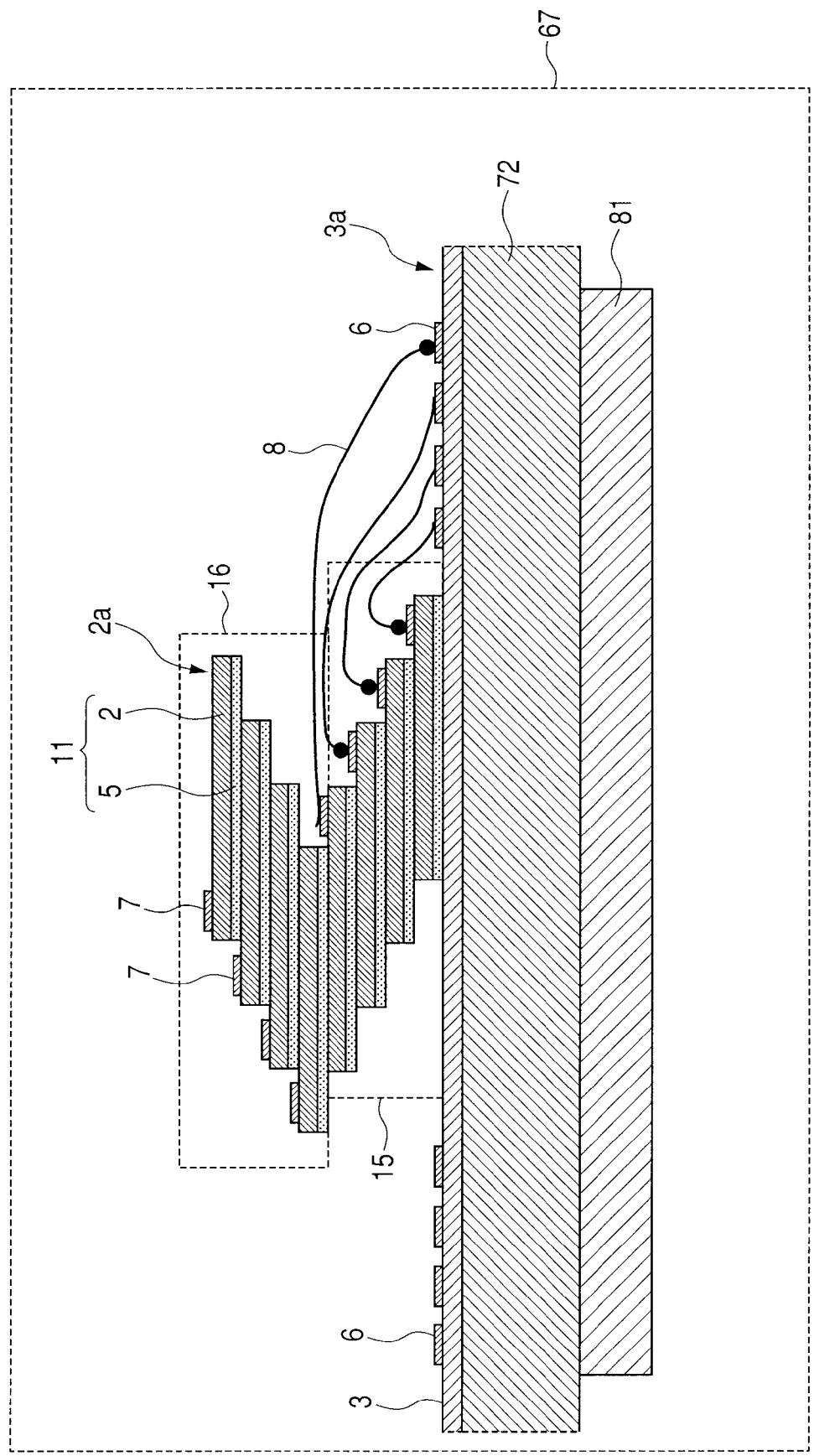
FIG. 18 is a schematic cross-sectional flow diagram of a device and equipment (when chip lamination is completed for the second lamination unit) corresponding to that of FIG. 15 in the case of lamination of further more steps.

In the die bonding method including such a step 116 of thermocompression bonding by gas phase static pressure (FIG. 2), approximately uniform pressure is applied also to an overhang part of the chip 2 from above and below as shown in FIG. 15 and FIG. 18, and bending or break does not occur. Further, while the chips form a step-like shape, the part without having another chip in the upper layer is also applied with approximately the same uniform pressure from above, and uniform bonding is carried out also in this part. Further, while there is a possibility that a horizontal shift of the chip may occur in the mechanical pressurization because a shift force is easily applied in the horizontal direction, the horizontal position shift does not occur in this case because the horizontal pressure is balanced between the front and back and between the left and right of the chip 2 (chip laminated body 11).

Further, as shown in FIG. 2 and FIG. 7, when a step 115 of pressurization processing by gas phase static pressure (main thermocompression bonding pre-processing) is carried out before the step 116 of thermocompression bonding processing by gas phase static pressure, the hardening of the adhesive layer 5 can be developed in the step 116 of thermocompression bonding processing by gas phase static pressure after a air layer, a bubble, and the like inside the adhesive layer 5 and between the adhesive layer 5 and the surface for adhesion have been discharged sufficiently by the step 115 of pressurization processing by gas phase static pressure, and thereby it is possible to realize a strong die bonding without a void or the like (in a case in which the adhesive layer 5 contains heat-curable resin as a main component). While such a step 115 of pressurization processing by gas phase static pressure is not always essential, the addition of this processing can contribute to the improvement of the die bonding property. Further, the step 115 of pressurization processing by gas phase static pressure is not necessarily an independent step but can be introduced as a step integrated with the temperature increasing step (t3 to t4) of FIG. 7.

As shown in FIG. 2 and FIG. 15, the main pressure bonding processing 112 (lamination processing) is carried out for the multi-layer laminated chips, which has a relatively weak adhesive state obtained only by the temporary pressure bonding processing, in the pressurization processing by gas phase static pressure (or same processing with additional heating), and thereby uniform pressurization becomes possible without depending on a chip area or a specific accumulation structure even for the relatively unstable structure.

Further, the main pressure bonding processing 112 (lamination processing) can be carried out for the chips in a lump, and it is possible to extremely improve a throughput compared to a process mechanically carrying out the main pressure bonding processing 112 (lamination processing) for one section or a unit of several sections one by one.

Note that the method of carrying out such main pressure bonding processing 112 (lamination processing) with the pressurization processing by gas phase static pressure (or same processing with additional heating) is effective for a thin film chip, that is, a chip having a thickness of 75 micrometers or smaller. In addition, the process is particularly effective for a chip having a thickness of 50 micrometers or smaller, and further the process is effective for securing reliability for a chip having a thickness of 30 micrometers or smaller. Note that the lower limit of the chip thickness is considered to be five micrometers for a typical integrated circuit, while the lower limit depends on the kind of device.

4. Explanation of an outline for an assembly process showing an example of a case providing further more multiple layers in a manufacturing method of semiconductor integrated circuit device in an embodiment of the present application (mainly, FIG. 18 to FIG. 20)

This section describes an example of a processing sequence for a case providing further more lamination layers in the assembly process described in Section 2. In the case providing further more accumulation layers, as shown in FIG. 16, at the time when the wire bonding process 102 has been completed (when a bonding process 104 which is defined as a process combining the die bonding process 101 of FIG. 1 and the wire bonding process 102, has been completed), the circuit substrate 3 is returned again to the same or other similar die bonding equipment 51 and the die bonding process 101 is carried out. That is, as shown in FIG. 18, for example, the die bonding process 101 (temporary pressure bonding and the main pressure bonding) is carried out for a predetermined number of the semiconductor chips 2 belonging to the second lamination unit 16 (the number of the chips is the same as that of the first lamination unit 15) by inverting the direction of the chips and bonding the chips over the semiconductor chips 2 in the top layer (chip laminated bodies in the top layer) belonging to the first lamination unit 15 as in the above process for the semiconductor chips 2 (chip laminated bodies 11) of the above first lamination layer 15.

Figure 19:
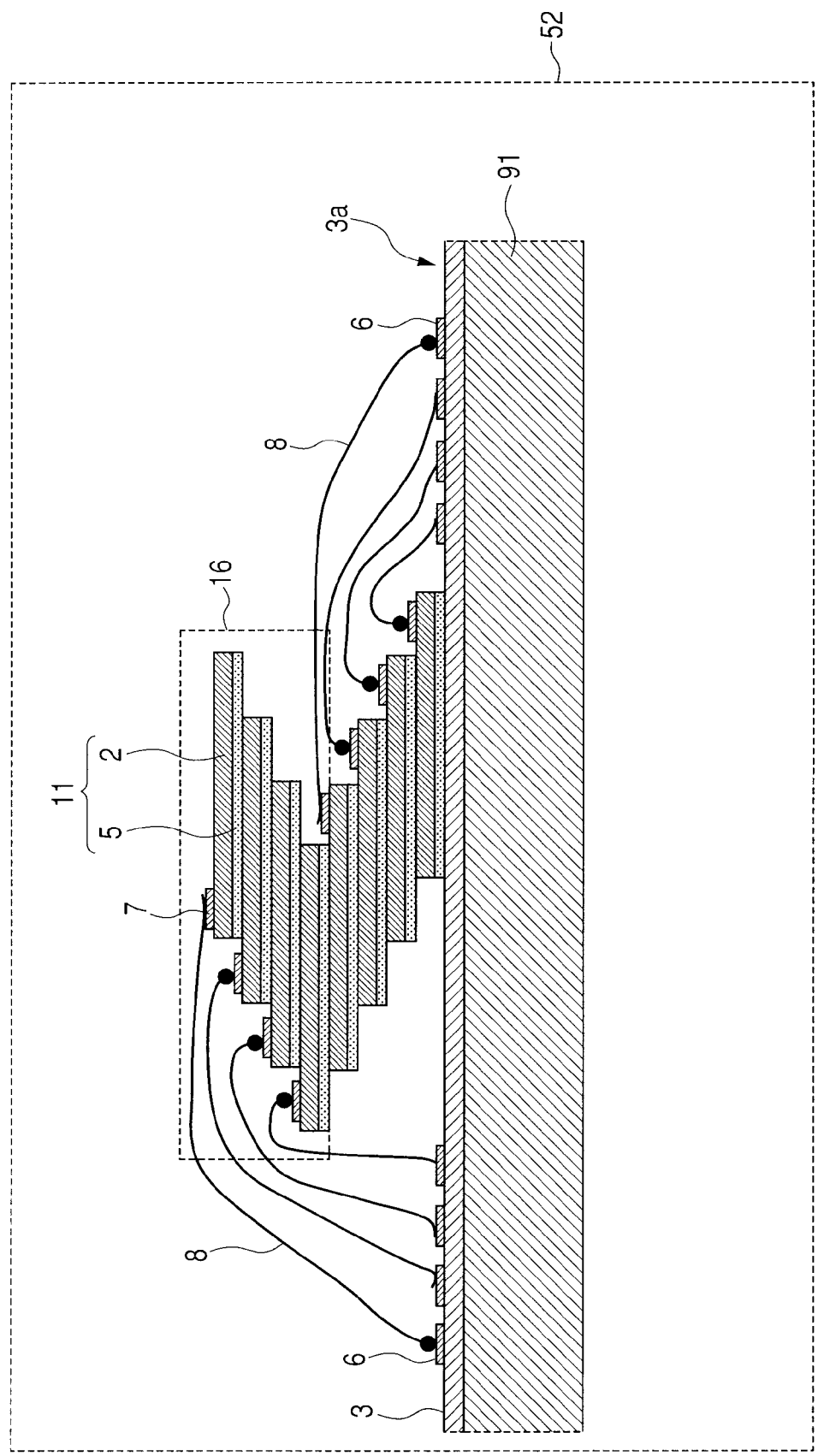
FIG. 19 is a schematic cross-sectional flow diagram of a device and equipment (when wire bonding is completed after chip lamination for the second lamination unit) corresponding to that of FIG. 16 in the case of lamination of further more steps.
Figure 20:
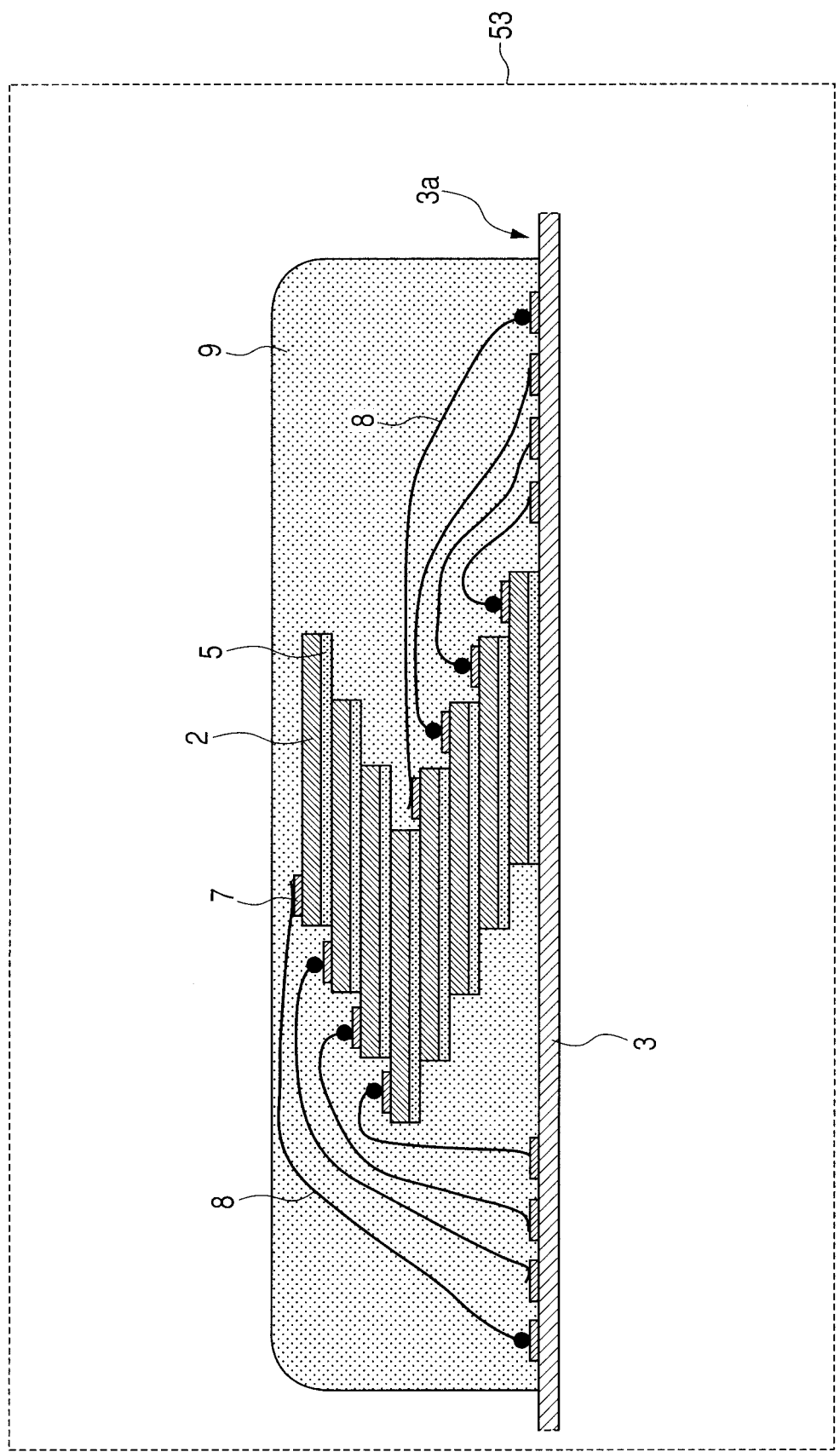
FIG. 20 is a schematic cross-sectional flow diagram of a device and equipment (resin sealing) corresponding to that of FIG. 17 in the case of lamination of further more steps.

Next, as shown in FIG. 19, the circuit substrate 3 is transferred to the same or other similar wire bonding equipment 52 and the wire bonding process 102 is carried out. That is, this bonding process 104 is repeated as needed and all the necessary semiconductor chips 2 (chip laminated bodies 11) are laminated and die-bonded to form a zigzag step-like shape. After that, as shown in FIG. 20, a resin sealing process 103 is carried out.

5. Summary

While the invention achieved by the inventor has been specifically described by the use of the embodiments hereinabove, the present invention is not limited to the description and obviously can be variously modified within a range not departing from the spirit thereof.

For example, while the above embodiments are explained for a specific case of laminating the chips in a step-like shape as an example, the invention of the present application is not limited to the case and obviously can be applied to another case of the lamination method.

What is claimed is:

1. A manufacturing method of semiconductor integrated circuit device comprising the steps of:
    (a) introducing a circuit substrate having a plurality of device regions over a first principal surface thereof into die bonding equipment;
    (b) fixing a plurality of chip laminated bodies each having a semiconductor chip in an upper layer and an adhesive layer on a rear side thereof in each of the device regions so as to laminate the chip laminated bodies in respective positions shifted from one another, in the die bonding equipment; and
    (c) after the step (b), applying uniform static gas pressure onto an exposed surface of each of the chip laminated bodies in a state that each of the chip laminated bodies is heated to a first temperature, in the die bonding equipment,
    wherein the static gas pressure is static air pressure.

2. The manufacturing method of semiconductor integrated circuit device according to claim 1, further comprising the step of
(d) after the step (b) and before the step c, applying uniform static gas pressure onto the exposed surface of each of the chip laminated bodies in a state that chip laminated body temperature is in a first temperature range lower than the first temperature, in the die bonding equipment.

3. The manufacturing method of semiconductor integrated circuit device according to claim 2, wherein
the adhesive layer is DAF.

4. The manufacturing method of semiconductor integrated circuit device according to claim 3, wherein
the step (c) is carried out in a state that the chip laminated bodies are accommodated in a single sealed chamber.

5. The manufacturing method of semiconductor integrated circuit device according to claim 4, wherein
the step (d) is carried out in a state that the chip laminated bodies are accommodated in a single sealed chamber.

6. The manufacturing method of semiconductor integrated circuit device according to claim 5, wherein
the step (d) is carried out in a state that the chip laminated bodies are accommodated in the same sealed chamber as that for the step (c).

7. The manufacturing method of semiconductor integrated circuit device according to claim 3,
wherein the step (c) is carried out in a state that the chip laminated bodies are accommodated in a single sealed chamber together with the circuit substrate.

8. The manufacturing method of semiconductor integrated circuit device according to claim 7, wherein
the step (d) is carried out in a state that the chip laminated bodies are accommodated in a single sealed chamber together with the circuit substrate.

9. The manufacturing method of semiconductor integrated circuit device according to claim 8, wherein
the step (d) is carried out in a state that the chip laminated bodies are accommodated in the same sealed chamber as that for the step (c).

10. The manufacturing method of semiconductor integrated circuit device according to claim 7, wherein
the chip laminated bodies are laminated in a step-like shape.

11. The manufacturing method of semiconductor integrated circuit device according to claim 1, wherein
a thickness in each of the semiconductor chips is 79 micrometers or less and 5 micrometers or more.

12. The manufacturing method of semiconductor integrated circuit device according to claim 11, wherein
the step (b) is carried out in a state that temperature of the semiconductor chip is within the first temperature range.

13. The manufacturing method of semiconductor integrated circuit device according to claim 11, wherein
the first temperature is from 70 to 160° C.

14. The manufacturing method of semiconductor integrated circuit device according to claim 11, wherein
the first temperature range is from a room temperature to 100° C.

15. The manufacturing method of semiconductor integrated circuit device according to claim 11, wherein the first temperature range is from 60 to 100° C.

16. The manufacturing method of semiconductor integrated circuit device according to claim 1, wherein
a thickness in each of the semiconductor chips is 50 micrometers or less and 5 micrometers or more.

17. The manufacturing method of semiconductor integrated circuit device according to claim 1, wherein
a thickness in each of the semiconductor chips is 30 micrometers or less and 5 micrometers or more.

18. The manufacturing method of semiconductor integrated circuit device according to claim 1, wherein
the circuit substrate is an organic circuit substrate.

19. The manufacturing method of semiconductor integrated circuit device according to claim 1, wherein
the adhesive layer contains heat-curable resin as a main component.

* * * * *